US010660221B2

(12) United States Patent
Liao et al.

(10) Patent No.: US 10,660,221 B2
(45) Date of Patent: May 19, 2020

(54) DISPLAY BOX AND DISPLAY DEVICE

(71) Applicant: Yungu (Gu'an) Technology Co., Ltd., Langfang (CN)

(72) Inventors: Fu Liao, Langfang (CN); Zhaoji Zhu, Langfang (CN); Xuebin Li, Langfang (CN); Desong Yan, Langfang (CN); Liwei Ding, Langfang (CN); Yuhua Wu, Langfang (CN); Hongqi Hou, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 16/366,827

(22) Filed: Mar. 27, 2019

(65) Prior Publication Data
US 2019/0223302 A1    Jul. 18, 2019

Related U.S. Application Data

(63) Continuation of application No. PCT/CN2018/119521, filed on Dec. 6, 2018.

(30) Foreign Application Priority Data

May 21, 2018 (CN) ..................... 2018 2 0758850 U

(51) Int. Cl.
*H05K 5/00* (2006.01)
*H05K 5/03* (2006.01)
(Continued)

(52) U.S. Cl.
CPC ............. *H05K 5/0017* (2013.01); *G02F 1/13* (2013.01); *G06F 1/1652* (2013.01);
(Continued)

(58) Field of Classification Search
CPC .......... H05K 5/0017; H05K 5/03; G02F 1/13; G06F 1/1652; G06F 3/0412; G06F 2203/04102
See application file for complete search history.

(56) References Cited

U.S. PATENT DOCUMENTS 10,582,612 B2 * 3/2020 Kwon .................. G06F 1/1626
2003/0221876 A1 * 12/2003 Doczy ................. G06F 1/1626
178/18.01
(Continued)

FOREIGN PATENT DOCUMENTS

CN     205485747 U    8/2016
CN     206429819 U    8/2017
(Continued)

OTHER PUBLICATIONS

Amazon.com, Multi Device Charging Station MSTJRY USB Charging Dock with Switch Cell Phone 5 Port Charging Station for Android Tablets, Aug. 18, 2020, https://www.amazon.com/dp/B07GZFJ4G5/ref=psdc_2407761011_t5_B0786VMVXW (Year: 2018).*

*Primary Examiner* — Ibrahim A Khan
(74) *Attorney, Agent, or Firm* — Rimon PC

(57) ABSTRACT

The present application provides a display box and a display device. The display box includes a box body and a first support plate detachably connected with the box body. The first support plate is one of multiple first support plates with different sizes, and the multiple first support plates are selectively detachably connected with the box body for supporting flexible screens with different bending radii.

13 Claims, 3 Drawing Sheets

(51) Int. Cl.
   *G06F 3/041*    (2006.01)
   *G02F 1/13*     (2006.01)
   *G06F 1/16*     (2006.01)

(52) U.S. Cl.
   CPC ............. *G06F 3/0412* (2013.01); *H05K 5/03*
   (2013.01); *G06F 2203/04102* (2013.01)

(56) References Cited

U.S. PATENT DOCUMENTS

| | | | | |
|---|---|---|---|---|
| 2010/0064564 | A1* | 3/2010 | Bemelmans | G06F 1/1601 |
| | | | | 40/607.01 |
| 2012/0307423 | A1* | 12/2012 | Bohn | G06F 1/1641 |
| | | | | 361/679.01 |
| 2012/0314399 | A1* | 12/2012 | Bohn | G06F 1/1616 |
| | | | | 362/97.1 |
| 2013/0021762 | A1* | 1/2013 | van Dijk | G06F 1/1652 |
| | | | | 361/749 |
| 2013/0120912 | A1* | 5/2013 | Ladouceur | H04M 1/0268 |
| | | | | 361/679.01 |
| 2013/0342094 | A1* | 12/2013 | Walters | H04M 1/0216 |
| | | | | 312/319.2 |
| 2014/0035869 | A1* | 2/2014 | Yun | G06F 3/0414 |
| | | | | 345/174 |
| 2014/0042293 | A1* | 2/2014 | Mok | G09F 9/301 |
| | | | | 248/682 |
| 2014/0337621 | A1* | 11/2014 | Nakhimov | G06F 1/163 |
| | | | | 713/168 |
| 2015/0130775 | A1* | 5/2015 | Kim | H04N 5/64 |
| | | | | 345/205 |
| 2015/0153862 | A1* | 6/2015 | Nakamura | G06F 3/041 |
| | | | | 345/173 |
| 2017/0307929 | A1* | 10/2017 | Nakazawa | G02F 1/133305 |
| 2018/0039471 | A1* | 2/2018 | Yanagisawa | G06F 3/14 |
| 2019/0059164 | A1* | 2/2019 | Hassemer | H05K 3/0044 |

FOREIGN PATENT DOCUMENTS

| | | |
|---|---|---|
| CN | 107331299 A | 11/2017 |
| CN | 207070977 U | 3/2018 |
| GB | 2489235 A | 9/2012 |

\* cited by examiner

DISPLAY BOX AND DISPLAY DEVICE

CROSS-REFERENCE TO RELATED APPLICATIONS

The present application is a continuation of International Application No. PCT/CN2018/119521 filed on Dec. 6, 2018, which claims priority to Chinese patent application No. 201820758850.1, filed on May 21, 2018. Both applications are incorporated herein in their entireties by reference.

TECHNICAL FIELD

The present application relates to the field of display technologies, particularly to a display box and a display device.

BACKGROUND

A flexible screen is a display screen adopting a flexible material and Organic Light-Emitting Diode (OLED) technology, and has characteristics such as flexibility compared to Liquid Crystal Display (LCD). For example, the flexible screen may be designed as a curved screen, a foldable display screen, a stretchable display screen, and the like. Moreover, since the flexible screen has characteristics such as flexibility, flexible screens with different bending radii have received great attention from the majority of merchants and consumers.

At present, when the flexible screens with different bending radii are displayed, each of the flexible screens is often fixed on a display box, and the flexible screens with different bending radii require different display boxes, which causes the problem of high cost of the flexible screens in displaying.

SUMMARY

In view of this, embodiments of the present application provide a display box and a display device, which solve the problem of high cost of the flexible screens in displaying.

An embodiment of the present application provides a display box including a box body and a first support plate detachably connected with the box body. The first support plate is one of a plurality of first support plates with different sizes, and the plurality of first support plates are selectively and detachably connected with the box body for supporting flexible screens with different bending radii.

In an embodiment of the present application, a first opening is defined in an upper surface of the box body, the first support plate is disposed in the first opening, and the first support plate and the upper surface of the box body has a preset angle defined therebetween. The box body includes a system mainboard connected with the flexible screen via the first opening, and the system mainboard includes a control module controlling the flexible screen to display.

Optionally, in another embodiment, the system mainboard further includes a display module and a touch module. The touch module is connected with the display module and the control module respectively. The touch module receives a touch operation of a user to the flexible screen, converts the touch operation into a trigger operation instruction, and sends the trigger operation instruction to the control module. The control module sends a display content corresponding to the trigger operation instruction to the display module, and controls the display module to display the display content.

In an embodiment of the present application, the box body further includes an insert disposed in the first opening, a first groove is defined in the insert to accommodate the first support plate, and a width of the first groove is adjusted according to a thickness of the first support plate.

In an embodiment of the present application, the first support plate is a rigid first support plate. The larger the bending radius of the flexible screen is, the larger the thickness of the rigid first support plate is.

In an embodiment of the present application, the first support plate is a flexible first support plate. The larger the bending radius of the flexible screen is, the larger the bending angle of the flexible first support plate is.

The box body further includes an upper cover. A first notch is defined in the upper cover, and the insert is inserted into the first notch from a lower end of the upper cover and is connected with the upper cover.

The box body further includes a middle frame and a lower cover. The middle frame is disposed between the upper cover and the lower cover. A plurality of gaps are defined in the middle frame, and a button is disposed in one of the plurality of gaps.

In an embodiment of the present application, a second opening is further defined in the upper surface of the box body. The display box further includes a second support plate disposed in the second opening for supporting an unfolded flexible screen, and an area of the second support plate is larger than an area of the first support plate.

In an embodiment of the present application, the first opening and the second opening are communicated with each other to form an opening, and the first support plate and the second support plate are disposed side by side along a length direction of the opening. A second groove is further defined in the insert, the first support plate is disposed in the first groove, and the second support plate is disposed in the second groove.

In an embodiment of the present application, the flexible screen includes a bending area and a non-bending area. The first support plate includes a flat plate portion, and a side surface of the flat plate portion is a curved surface. When the flexible screen is placed on the first support plate, the non-bending area is attached to an upper surface and a lower surface of the flat plate portion, and the bending area is attached to a surface of the curved surface. A thickness of the flat plate portion is double of the bend radius.

In an embodiment of the present application, the bending radius of the flexible screen ranges from 0.2 mm to 15 mm.

An embodiment of the present application further provides a display device including the display box described above and a flexible screen disposed on the first support plate of the display box.

The display box provided by the embodiments of the present application, by means of a detachable first support plate on the box body, makes it not necessary to replace the entire display box when the flexible screens with different bending radii are displayed, and only the first support plate needs to be replaced, thereby reducing a cost of displaying the flexible screens.

DETAILED DESCRIPTION

A clear and complete description of technical solutions in the embodiments of the present application will be given below, in combination with the accompanying drawings in the embodiments of the present application. Apparently, the described embodiments are a part of the embodiments of the present application, but not all of the embodiments. All other embodiments, obtained by those skilled in the art based on the embodiments of the present application without creative efforts, shall fall within the protection scope of the present application.

Figure 1:
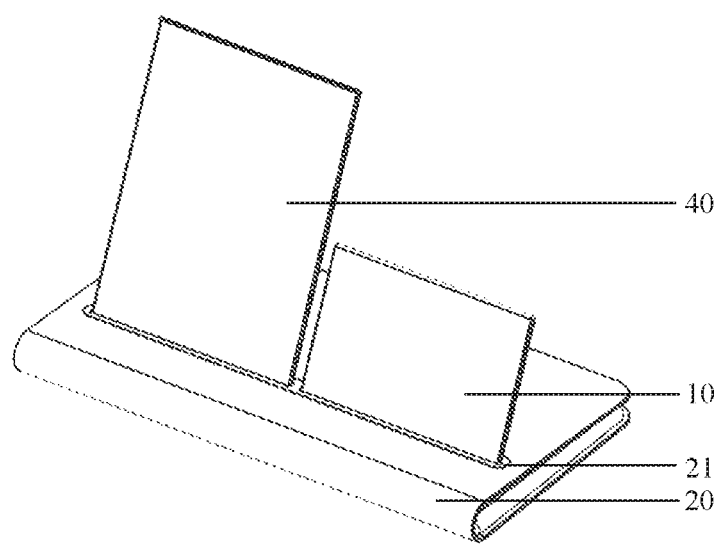
FIG. 1 is a schematic structural diagram illustrating a display box according to the present application.

FIG. 1 is a schematic structural diagram illustrating a display box according to the present application.

As shown in FIG. 1, the display box includes a first support plate 10 and a box body 20. The first support plate 10 is detachably connected with the box body 20. The first support plate 10 is one of multiple first support plates with different sizes, and the multiple first support plates are selectively and detachably connected with the box body 20 for supporting flexible screens with different bending radii.

Specifically, the first support plate 10 is disposed above the box body 20, and the first support plate 10 is detachably connected with the box body 20, and a connection manner may be a threaded connection, a clearance fit, and the like. Further, the first support plate 10 may be a rigid first support plate or a flexible first support plate. For example, the flexible first support plate may be made of a material such as a shape memory polymer, a polydimethylsiloxane (PDMS) dispersed with titanium dioxide particles, or the like, which may vary into different shapes depending on a shape of a flexible screen. Further, the shape of the first support plate 10 may be a plate shape, an arch shape, a V shape, or the like, which is not limited in the embodiments of the present application. For example, when the shape of the first support plate 10 is the plate shape, one end of the first support plate 10 is detachably connected with the box body 20, and the flexible screen may be placed across an upper surface and a lower surface of the first support plate 10; when the shape of the first support plate 10 is the arch shape, one end of the first support plate 10 may be detachably connected with the box body 20, or both ends of the first support plate 10 may be detachably connected with the box body 20, and the flexible screen may be attached to the arched first support plate 10.

It should be noted that the display box of FIG. 1 further includes a second support plate 40 and an insert 21. The second support plate 40 and the insert 21 are both optional and may or may not be existed.

According to the embodiments of the present application, a detachable first support plate is disposed on the box body, so that it is not necessary to replace the entire display box when the flexible screens with different bending radii are displayed, and only the first support plate needs to be replaced, thereby reducing a cost of displaying the flexible screens.

According to an embodiment of the present application, a first opening is defined in an upper surface of the box body 20, the first support plate 10 is disposed in the first opening, and the first support plate 10 and the upper surface of the box body 20 has a preset angle θ defined therebetween. The box body 20 includes a system mainboard which is connected with the flexible screen, and the system mainboard includes a control module controlling the flexible screen to display.

Specifically, the first support plate 10 is disposed in the first opening of the upper surface of the box body 20 and is at a preset angle θ with the upper surface of the box body 20, and the preset angle θ may range from 0° to 180°. For example, the preset angle θ in FIG. 1 may be an acute angle between the first support plate 10 and the upper surface of the box body 20. When the θ is 0° or 180°, the shape of the first support plate 10 may be a shape with a curvature, for example, an arch shape or the like. When 0°<θ<180°, the shape of the first support plate 10 may be a flat plate shape, an arch shape, or the like. The flexible screen may be attached to the surface of the first support plate 10 along the contour of the first support plate 10. In addition, a third opening may further be disposed in the upper surface of the box body 20 and be detachably connected with the first support plate 10. For example, one end of the arched first support plate 10 is detachably connected with the first opening, and the other end is detachably connected with the third opening.

The system mainboard includes a control module, the control module may refer to a control circuit and the control module may be electrically connected with the flexible screen. For example, an interface may be disposed on the upper surface of the box body 20, and the flexible screen is connected with the system mainboard through the interface. Optionally, the flexible screen may also be directly connected with a flexible circuit board. For example, a fourth opening may be disposed in the upper surface of the box body 20, and the flexible circuit board is connected with the system mainboard through the fourth opening so as to be connected with the control module through the system mainboard. The control module may control the flexible screen through a control instruction. Specifically, the control module sends the control instruction to the flexible screen, and when receiving the control instruction sent by the control module, the flexible screen may display according to the control instruction. Further, the control module may be a microcontroller such as a single chip microcomputer, an Advanced RISC Machines (ARM), and the like, and may also be other microprocessors, which is not limited by the present application. In addition, when the first support plate 10 is the flexible first support plate, the control module may further control a shape change of the flexible first support plate. For example, when the flexible screen is arched, the control module can control the flexible first support plate to make its shape also arched, and of course, the flexible first support plate can also be controlled to restore its original shape by the control module.

Optionally, in another embodiment of the present application, the system mainboard further includes a display module and a touch module, the display module may refer to a display panel, and the touch module may refer to a touch circuit. The touch module is connected with the display module and the control module respectively. The touch module receives a touch operation of a user to the flexible screen, converts the touch operation into a trigger operation instruction, and sends the trigger operation instruction to the control module. The control module sends a display content corresponding to the trigger operation instruction to the display module, and controls the display module to display the display content.

Specifically, the system mainboard may include the control module and the display module, and the display module is configured to receive the control instruction of the control module, and control the flexible screen to display based on the control instruction. The system mainboard may also include the control module, the display module and the touch module, and the touch module is connected with the display module and the control module respectively. When receiving the touch operation (for example, sliding, clicking, dragging, etc.) of a user to the flexible screen, the touch module converts the touch operation into the trigger operation instruction, and sends the trigger operation instruction to the control module. The control module sends the display content corresponding to the trigger operation instruction to the display module, and controls the display module to display the display content. The format of the display content may include, but is not limited to, .azw, .txt, .pdf, .mobi, .prc, .doc, .jpg, and the like.

According to the embodiments of the present application, the display module and the touch module are disposed on the system mainboard, so that the system mainboard is modularized partially, thereby making the replacement of the flexible screen easier and more convenient.

Optionally, in another embodiment of the present application, the box body 20 further includes a storage module connected with the control module and configured to store the display content on the flexible screen when the flexible screen is displayed.

Specifically, the box body 20 further includes a storage module connected with the control module and configured to store the display content on the flexible screen. The storage module may be built-in (for example, NAND Flash Memory) or external (for example, Secure Digital (SD) card), or may be a combination of built-in and external, which is not limited by the present application.

Optionally, the box body 20 further includes a Wireless-Fidelity (WiFi) interface connected with the control module. Specifically, the control module controls the download of the content on the flexible screen by controlling the WiFi interface. In addition, the above WiFi interface may also be other interfaces, such as Bluetooth, Universal Serial Bus (USB) interface, and the like.

Figure 2:
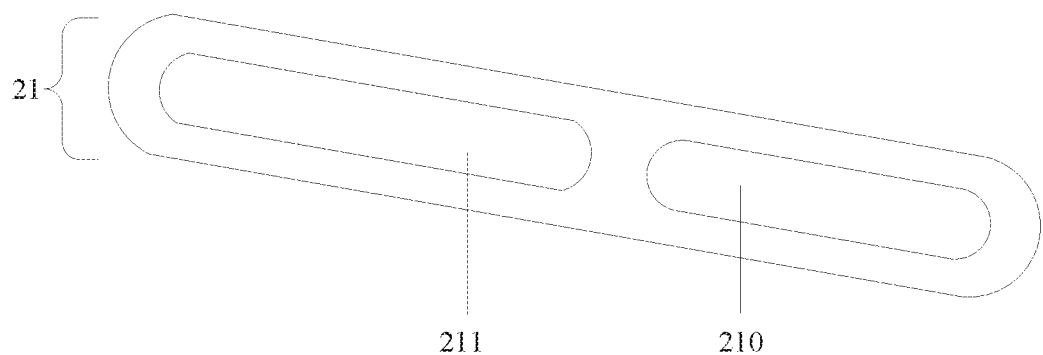
FIG. 2 is a top view illustrating an insert according to the present application.

FIG. 2 is a top view illustrating an insert according to the present application.

As shown in FIG. 1 and FIG. 2, the box body 20 further includes an insert 21 disposed in the first opening. A first groove 210 is disposed in the insert 21 for accommodating the first support plate 10, and a width of the first groove 210 can be adjusted with a thickness of the first support plate 10. It should be noted that the insert 21 in FIG. 2 further includes a second groove 211, and the second groove 211 is optional and may or may not be existed.

According to an embodiment of the present application, the thickness of the first support plate 10 depends on a bending radius of a flexible screen to be supported, and the larger the bending radius of the flexible screen to be supported, the larger the thickness of the first support plate 10.

For example, the first support plate 10 may be a rigid first support plate, and its shape may be a plate shape, for example, a rectangular flat plate and the like. The flexible screen to be supported may be placed across the first support plate 10, and at this time, the larger the bending radius of the flexible screen to be supported, the larger the thickness of the first support plate 10. Thus, an opening length of the first groove 210 may be greater than or equal to a length of the first support plate 10 along a direction of the first groove 210, and an opening width of the first groove 210 may be greater than or equal to twice a maximum thickness of the first support plate 10. The first support plate 10 may be selected according to the length of the flexible screen to be supported along the direction of the first groove 210 and the bending radius thereof.

Optionally, the first support plate is a flexible first support plate, a bending angle of the flexible first support plate depends on the bending radius of the flexible screen to be supported, and the larger the bending radius of the flexible screen to be supported, the larger the bending angle of the flexible first support plate. For example, a shape of the flexible screen to be supported is an arc shape, and the flexible first support plate may also be arranged in an arc shape according to the shape of the flexible screen to be supported. At this time, because the flexible screen to be supported is attached to the flexible first support plate, the bending angle of the flexible first support plate depends on the bending radius of the flexible screen to be supported.

Optionally, in another embodiment, a second opening is further defined in the upper surface of the box body 20. The display box further includes a second support plate 40 disposed in the second opening for supporting an unfolded flexible screen, and the area of the second support plate 40 is larger than the area of the first support plate 10.

Specifically, the position of the second opening may be any position on the box body 20 except that of the first opening, as long as the normal display of the first support plate 10 and the second support plate 40 are ensured. The unfolded flexible screen may be the flexible screen 30 in an unfolded state, other flexible screens in an unfolded state, or a non-flexible screen.

As shown in FIG. 1, the display box includes the first support plate 10, the box body 20 and the second support plate 40. The second opening is further defined in the box body 20, the second support plate 40 is disposed in the second opening, and the connection manner thereof may be a fixed connection or a detachable connection. The second support plate 40 is configured to support the unfolded flexible screen, and the unfolded flexible screen may be the flexible screen 30 in an unfolded state for displaying the unfolded state of the flexible screen 30 in contrast to the flexible screen 30. Alternatively, the second support plate 40 may also be configured to support a non-flexible screen such as a liquid crystal display and the like. The flexible screen 30 and the non-flexible screen may form a vivid contrast when displayed, so that the visitor may experience the difference between the flexible screen and the non-flexible screen more intuitively.

In addition, the insert 21 may also be disposed in the second opening, the second groove may further be defined in the insert 21 for accommodating the second support plate 40, and the width of the second groove may be adjusted according to the thickness of the second support plate. The factor of determining the size of the second groove is similar to that of the first groove 210, and will not be described redundantly herein.

According to an embodiment of the present application, the first opening and the second opening are communicated with each other to form an opening, and the first support plate 10 and the second support plate 40 are disposed side by side along a length direction of the opening. The length direction of the opening is a length direction of the first groove 210. A second groove 211 is further defined in the insert 21, the first support plate 10 is disposed in the first groove 210, and the second support plate 40 is disposed in the second groove 211.

Specifically, the first opening and the second opening may be communicated with each other to form a common opening, or may be different openings. An insert may be disposed on the box body 20, and the insert(s) may be disposed in the first opening and/or the second opening, that is, there may be one or two inserts.

As shown in FIG. 1 and FIG. 2, the first opening and the second opening are communicated with each other to form the common opening, collectively referred to as an opening. The box body 20 further includes the insert 21 disposed in the opening. The first groove 210 and the second groove 211 are arranged side by side along a straight line on the insert 21, the first support plate 10 is disposed in the first groove 210, and the second support plate 40 is disposed in the second groove 211. In the embodiment of the present application, the opening width of the first groove 210 may be greater than or equal to twice the maximum thickness of the first support plate 10, and the first support plate 10 may be connected with the insert 21 at the first groove 210 by bolts, snaps, matching grooves designed for installation, or the like. The opening width of the second groove 211 may be greater than or equal to twice the maximum thickness of the second support plate 40, and the second support plate 40 may be connected with the insert 21 at the second groove 211 by bolts, snaps, matching grooves designed for installation, or the like. In this way, when different flexible screens 30 and/or unfolded flexible screens are replaced, the first support plate 10 and the second support plate 40 may be replaced directly without replacing the box body 20, thereby saving the cost.

Alternatively, the first opening and the second opening are different openings. Different inserts may be disposed at the first opening and the second opening respectively, and types of the first support plate 10 and the second support plate 40 are selected according to the sizes of the flexible screen 30 and the unfolded flexible screen, thereby determining the sizes of the first groove and the second groove.

In another embodiment of the present application, the sizes of the first groove and the second groove may match with the flexible screen 30 and the unfolded flexible screen respectively. For example, the opening width of the first groove 210 may be equal to twice the thickness of the flexible screen 30. When the flexible screen 30 and/or the unfolded flexible screen are replaced, the insert and the support plate may be replaced at the same time.

According to the embodiments of the present application, the insert not only makes the replacement of the flexible screen 30 and the unfolded flexible screen with different thicknesses easier to be realized and more convenient, but also plays a role of decorating the box body to make the box body more beautiful and improve the experience degree of the display box.

Figure 3:
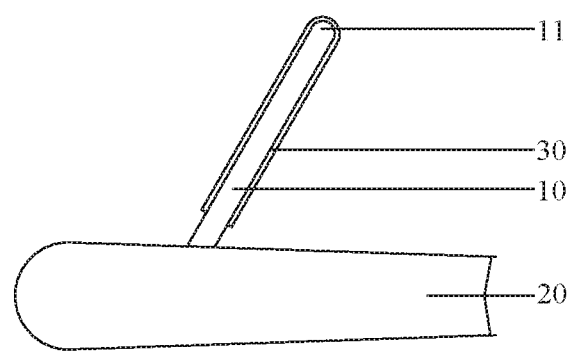
FIG. 3 is a side view illustrating a display box according to the present application.

FIG. 3 is a side view illustrating a flexible screen display box according to the present application.

According to an embodiment of the present application, the flexible screen 30 includes a bending area and a non-bending area. The first support plate 10 includes a flat plate portion, and a side surface of the flat plate portion is a curved surface. When a flexible screen with the bending area is placed on the first support plate 10, the non-bending area is attached to an upper surface and/or a lower surface of the flat plate portion, the bending area is attached to a surface of the curved surface, and a thickness of the flat plate portion is equal to twice the bending radius.

Specifically, the first support plate 10 is a structure with a certain strength, and its shape may include a shape of the flat plate portion, for example, a circular flat plate shape, a rectangular flat plate shape, a polygonal flat plate shape, or other various flat plate shapes. The side surface of the flat plate portion is a curved surface, and preferably, the curved surface may be a semi-circular surface. For example, one side surface of the first support plate 10 is disposed in the first opening, and the side surface paralleled to the first opening is a convex curved surface 11.

The flexible screen 30 may be attached to the first support plate 10 entirely, or may be attached to the first support plate 10 partially. As shown in FIG. 3, the flexible screen 30 includes a bending area and a non-bending area, and may be attached to the above first support plate 10, which is similar to the rectangular parallelepiped. The bending area is located at an intermediate portion of the flexible screen 30. The non-bending area may be attached to the upper surface and the lower surface of the first support plate 10, and the bending area may be attached to the convex curved surface 11 of the first support plate 10 paralleled to the first opening. The bending area may be made of a bendable material or a non-bendable material. In a preferred embodiment, a curvature center of the convex curved surface 11 coincides with a curvature center of the bending area of the flexible screen 30. That is, a radius of the semi-circle is equal to the bending radius, so that the bending area may be attached to the convex curved surface 11 completely and fully to maximize the supporting action of the convex curved surface 11. Further, the radius of the semi-circle or the thickness of the first support plate 10 is from 0.2 mm to 15 mm, and flexible screens 30 with different bending radii may correspond to convex curved surfaces 11 with different radii or first support plates 10 with different thicknesses.

In addition, as shown in FIG. 3, the flexible screen 30 may be divided into a first display portion, a second display portion and a third display portion. The first display portion and the second display portion may be the non-bending area located on the upper surface and the lower surface of the first support plate 10, and the third display portion may be the bending area on the convex curved surface 11 of the first support plate 10. When the control module controls the flexible screen 30 to display, the above display portions may be controlled separately. For example, at least one of the first display portion, the second display portion and the third display portion may be controlled to display.

Based on the embodiments of the present application, the flat-plate-shaped support plate with the convex curved surface 11 may provide a better supporting effect, so that the bending life of the flexible screen is enhanced. Moreover, the flexible screens with different bending radii may correspond to different first support plates. When the flexible screen needs to be replaced, only the different first support plates may be replaced, which reduces the display cost of the flexible screens.

Figure 4:
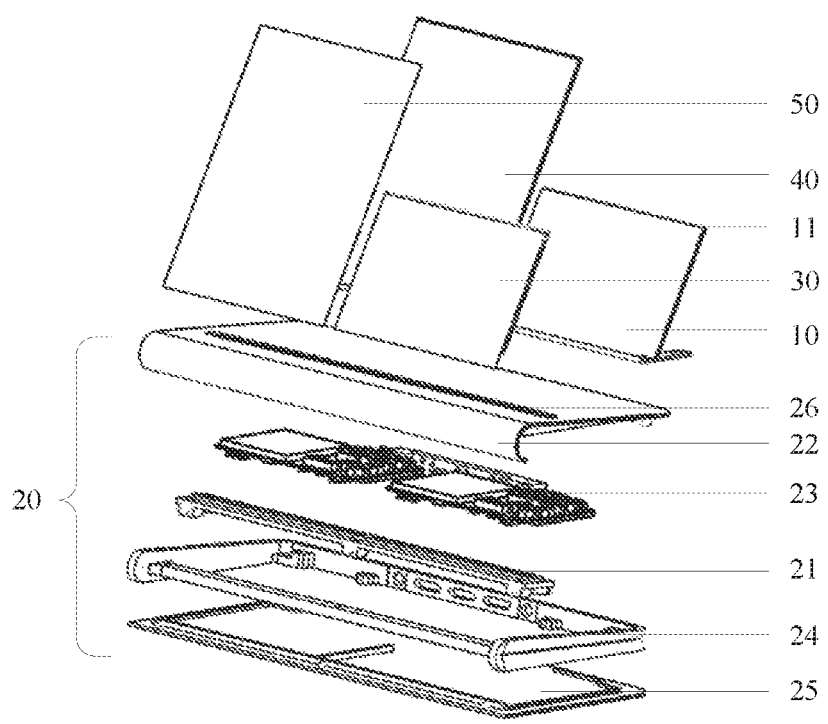
FIG. 4 is an exploded view illustrating a flexible screen display box according to the present application.

FIG. 4 is an exploded view illustrating a flexible screen display box according to the present application.

As shown in FIG. 4, the flexible screen display box includes a first support plate 10, a box body 20, and a second support plate 40. The box body 20 includes an insert 21, an upper cover 22, a system mainboard 23, a middle frame 24, and a lower cover 25. A first notch 26 is defined in the upper cover 22.

Specifically, a flexible screen 30 and an unfolded flexible screen 50 are attached to the first support plate 10 and the second support plate 40 respectively. Further, the flexible screen 30 includes a bending area and a non-bending area, the non-bending area may be attached to the upper surface and the lower surface of the first support plate 10, and the bending area may be attached to the convex curved surface 11 of the first support plate 10. Further, the flexible screen 30 and the unfolded flexible screen 50 may be touch screens.

As shown in FIG. 1 to FIG. 4, the first notch 26 is defined in the upper surface of the upper cover 22, and the first groove 210 and the second groove 211 are defined in the upper surface of the insert 21. The insert 21 is inserted into the first notch 26 from a lower end of the upper cover 22 and is fixedly or detachably connected with the upper cover 22, which is not limited by the embodiments of the present application. The first support plate 10 and the second support plate 40 are disposed in the first groove 210 and the second groove 211 respectively and are at a preset angle θ with the upper cover 22, and the θ in FIG. 1 and FIG. 3 is an acute angle. Further, the first support plate 10 and the second support plate may be fixed in the first groove 210 and the second groove 211 by bolts, snaps, matching grooves designed for installation, or the like.

The system mainboard 23 may include, but is not limited to, a control module, a display module, a touch module, a storage module, and the like.

The box body 20 further includes the middle frame 24 and the lower cover 25. The middle frame 24 is disposed between the upper cover 22 and the lower cover 25. A plurality of gaps are defined in the middle frame 24. A button, for example, a menu button, a confirmation button, a selection button, an exit button, and the like, may be disposed at a position corresponding to one of the plurality of gaps. For example, the button is disposed in one gap. In addition, the box body 20 further includes at least one interface, such as a network interface, an audio interface, a peripheral interface, and the like.

It should be noted that the positions and directions of the first notch 26, the first groove 210 and the second groove 211 are not limited to the above positions and directions, and may be designed based on the actual needs of displaying the flexible screen 30 and/or the unfolded flexible screen 50. For example, the direction of the opening, that is, the direction of the first notch 26, the first groove 210 and the second groove 211, is not limited to the longitudinal direction as shown in FIG. 1 and FIG. 4, further may be a lateral direction or an oblique direction at a preset angle with either side of the upper cover 22.

The present application further provides a flexible screen display device including the above flexible screen display box and the flexible screen 30, and the flexible screen 30 is disposed on the first support plate 10 of the display box.

As shown in FIG. 4, the flexible screen display device may include the flexible screen 30 and the display box. The flexible screen 30 may be fixed on the first support plate 10 or may be detachably connected with the first support plate 10. For example, the flexible screen 30 is adhered to the first support plate 10 by using a double-sided tape or the like, or a groove may be disposed on the first support plate 10, and a periphery of the flexible screen 30 may be inserted into the groove of the first support plate 10. It should be noted that a connection manner of the unfolded flexible screen 50 and the second support plate 40 may be the same as that of the flexible screen 30 and the first support plate 10.

Based on the embodiments of the present application, the first support plate and the flexible screen on the flexible screen display device may be detached, so that when the flexible screens with different bending radii are displayed, it is not necessary to replace the entire display box, only the first support plate needs to be replaced, which reduces the cost of displaying the flexible screens.

The above are only the preferred embodiments of the present application and are not intended to limit the present application. Any modifications, equivalent substitutions, and the like made within the spirit and principle of the present application should be included within the protection scope of the present application.

What is claimed is:

1. A display box, comprising:
a box body; and
a first support plate detachably connected with the box body, the first support plate being one of a plurality of first support plates with different sizes, the plurality of first support plates being selectively and detachably connected with the box body for supporting flexible screens with different bending radii;
wherein a first opening is defined in an upper surface of the box body, the first support plate is disposed in the first opening, and the first support plate and the upper surface of the box body has a preset angle defined therebetween, and;
wherein the box body comprises a system mainboard connected with the flexible screen via the first opening, and the system mainboard comprises a control module controlling the flexible screen to display.

2. The display box according to claim 1, wherein the system mainboard further comprises a display module and a touch module;
the touch module is connected with the display module and the control module respectively;
the touch module receives a touch operation of a user to the flexible screen, converts the touch operation into a trigger operation instruction, and sends the trigger operation instruction to the control module; and
the control module sends a display content corresponding to the trigger operation instruction to the display module, and controls the display module to display the display content.

3. The display box according to claim 1, wherein the box body further comprises an insert disposed in the first opening, a first groove is defined in the insert to accommodate the first support plate, and a width of the first groove is adjusted according to a thickness of the first support plate.

4. The display box according to claim 3, wherein the box body further comprises an upper cover, a first notch is defined in the upper cover, and the insert is inserted into the first notch from a lower end of the upper cover and is connected with the upper cover.

5. The display box according to claim 4, wherein the box body further comprises a middle frame and a lower cover, the middle frame is disposed between the upper cover and the lower cover, a plurality of gaps are defined in the middle frame, and a button is disposed in one of the plurality of gaps.

6. The display box according to claim 1, wherein the first support plate is a rigid first support plate, and the larger the bending radius of the flexible screen is, the larger the thickness of the rigid first support plate is.

7. The display box according to claim 1, wherein the first support plate is a flexible first support plate, and the larger the bending radius of the flexible screen is, the larger the bending angle of the flexible first support plate is.

8. The display box according to claim 3, wherein a second opening is further defined in the upper surface of the box body;
the display box further comprises a second support plate disposed in the second opening for supporting an unfolded flexible screen, and an area of the second support plate is larger than an area of the first support plate.

9. The display box according to claim 8, wherein the first opening and the second opening are communicated with each other to form an opening, the first support plate and the second support plate are disposed side by side along a length direction of the opening;

a second groove is further defined in the insert, the first support plate is disposed in the first groove, and the second support plate is disposed in the second groove.

10. The display box according to claim 1, wherein the flexible screen comprises a bending area and a non-bending area, the first support plate comprises a flat plate portion, and a side surface of the flat plate portion is a curved surface;

when the flexible screen is placed on the first support plate, the non-bending area is attached to an upper surface and/or a lower surface of the flat plate portion, and the bending area is attached to a surface of the curved surface.

11. The display box according to claim 10, wherein a thickness of the flat plate portion is double of the bending radius.

12. The display box according to claim 1, wherein the bending radius of the flexible screen ranges from 0.2 mm to 15 mm.

13. A display device, comprising: the display box according to claim 1; and a flexible screen disposed on the first support plate of the display box.

* * * * *